US010340935B1

United States Patent
Tanabe et al.

(10) Patent No.: US 10,340,935 B1
(45) Date of Patent: Jul. 2, 2019

(54) THERMOMETER DIGITAL TO ANALOG CONVERTER (71) Applicant: Dialog Semiconductor (UK) Limited, London (GB)

(72) Inventors: Hirohisa Tanabe, Yokohama (JP); Seiichi Ozawa, Wakoh (JP)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/869,617

(22) Filed: Jan. 12, 2018

(51) Int. Cl.
*H03M 1/10* (2006.01)
*H03M 1/76* (2006.01)

(52) U.S. Cl.
CPC ......... *H03M 1/1071* (2013.01); *H03M 1/765* (2013.01)

(58) Field of Classification Search
CPC ............................ H03M 1/765; H03M 1/1071
USPC .................................................. 341/130–144
See application file for complete search history.

(56) References Cited

U.S. PATENT DOCUMENTS

| 5,680,132 | A | * | 10/1997 | Kobatake | .............. | H01L 23/528 |
| | | | | | | 257/E23.121 |
| 5,812,595 | A | * | 9/1998 | Jandu | ....................... | H03K 7/08 |
| | | | | | | 326/90 |
| 6,163,283 | A | | 12/2000 | Schofield | | |
| 6,225,929 | B1 | | 5/2001 | Beck | | |
| 6,329,860 | B1 | * | 12/2001 | Komatsu | .............. | H03K 3/0231 |
| | | | | | | 327/105 |
| 7,068,201 | B1 | | 6/2006 | Chou | | |
| 9,734,904 | B1 | * | 8/2017 | Cho | .................... | G11C 13/0038 |
| 2004/0212526 | A1 | * | 10/2004 | Mallinson | ........... | H03M 1/0604 |
| | | | | | | 341/145 |

* cited by examiner

*Primary Examiner* — Lam T Mai (74) *Attorney, Agent, or Firm* — Saile Ackerman LLC; Stephen B. Ackerman (57) ABSTRACT

A thermometer-coded Digital to Analog Converter (DAC) is described, whose output is changed with fast speed, and reduced output overshoot or undershoot. The thermometer-coded DAC has selection switches and an up/down counter, with DAC codes separated into higher and lower bits. The lower bits increase up to a maximum code, then decrease. The configuration of resistors in the DAC reduces output spike, especially at the DAC code changing point.

21 Claims, 9 Drawing Sheets

Prior Art
Original code<6:0> 0->1->2->3...15->16...31->32...47->48...63->64...
Upper bits<6:4>   0              ->1         ->2        ->3        ->4
Lower bits<3:0>   0->1->2->3...15->0....15->0....15->0....15->0....

Present Disclosure
Original code<6:0> 0->1->2->3...15->16...31->32...47->48...63->64...
Upper bits<6:4>   0              ->1         ->2        ->3        ->4
Lower bits<3:0>   0->1->2->3...15->15....0->0....15->15....0->0....

THERMOMETER DIGITAL TO ANALOG CONVERTER

BACKGROUND

Field

The disclosure relates generally to resistor string based Digital to Analog Converters (DAC), and in particular to thermometer DACs whose output is switched at fast speeds.

Description

A thermometer DAC contains an equal resistor or current-source segment for each possible value of the DAC output. This configuration results in a high precision architecture but at the expense of high cost in silicon 'real estate' (i.e., the space required on an integrated circuit) for the control logic. Generally speaking, an n-bit thermometer-coded DAC can have up to $2^n$ switches. To control every switch separately, a large amount of control/decoding logic is necessary.

Figure 1:
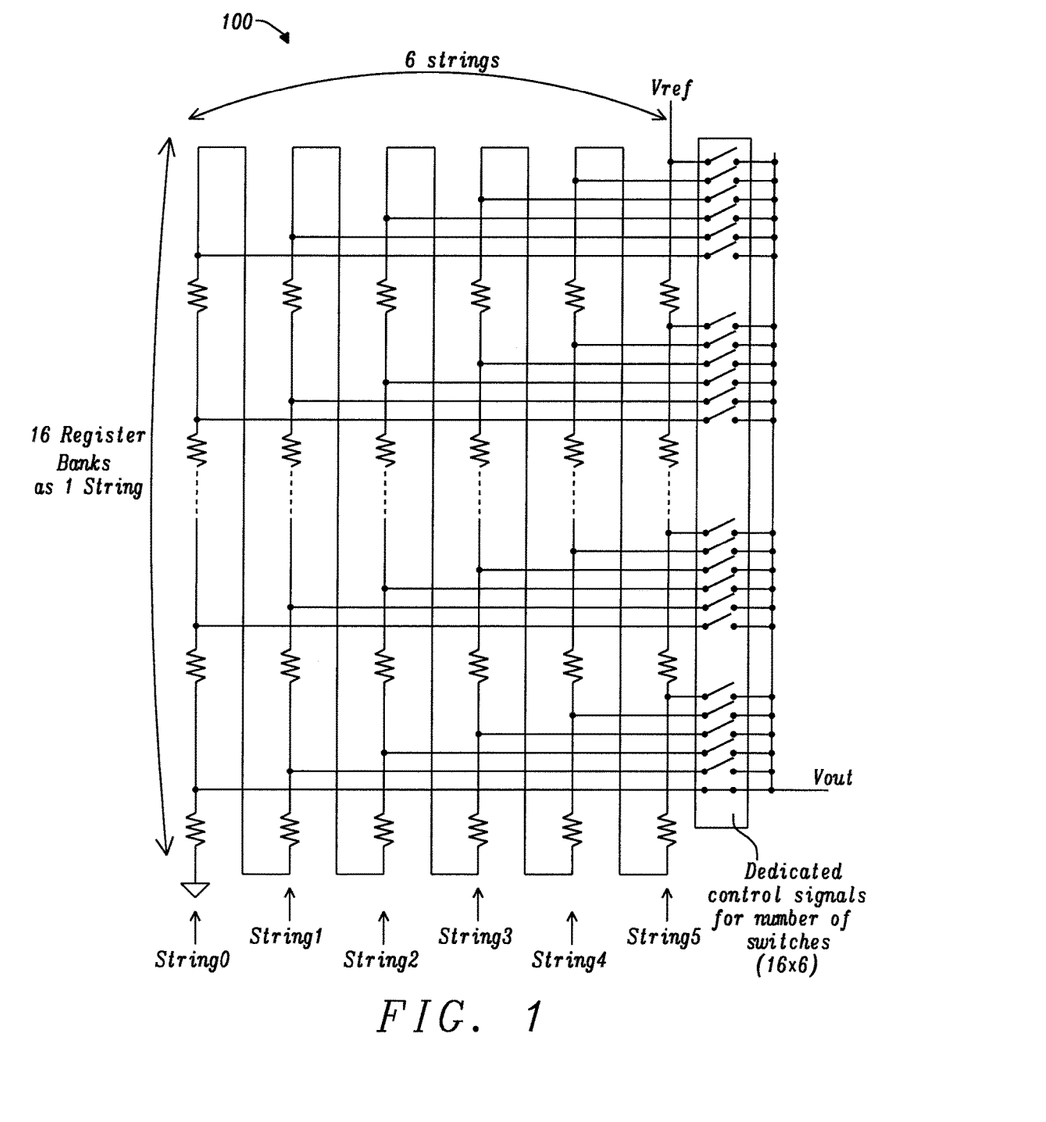
FIG. 1 illustrates a general thermometer-coded Digital to Analog Converter (DAC) of the prior art.

In FIG. 1, general thermometer-coded DAC 100 is shown. Here, there are 6 strings of 16 resistor banks (banksels), and 96 switches (16×6), with 96 dedicated control signals needed to turn the switches on/off. The resistor strings are supplied with reference voltage Vref, and each of the control signals may be used to determine DAC output voltage Vout.

Figure 2:
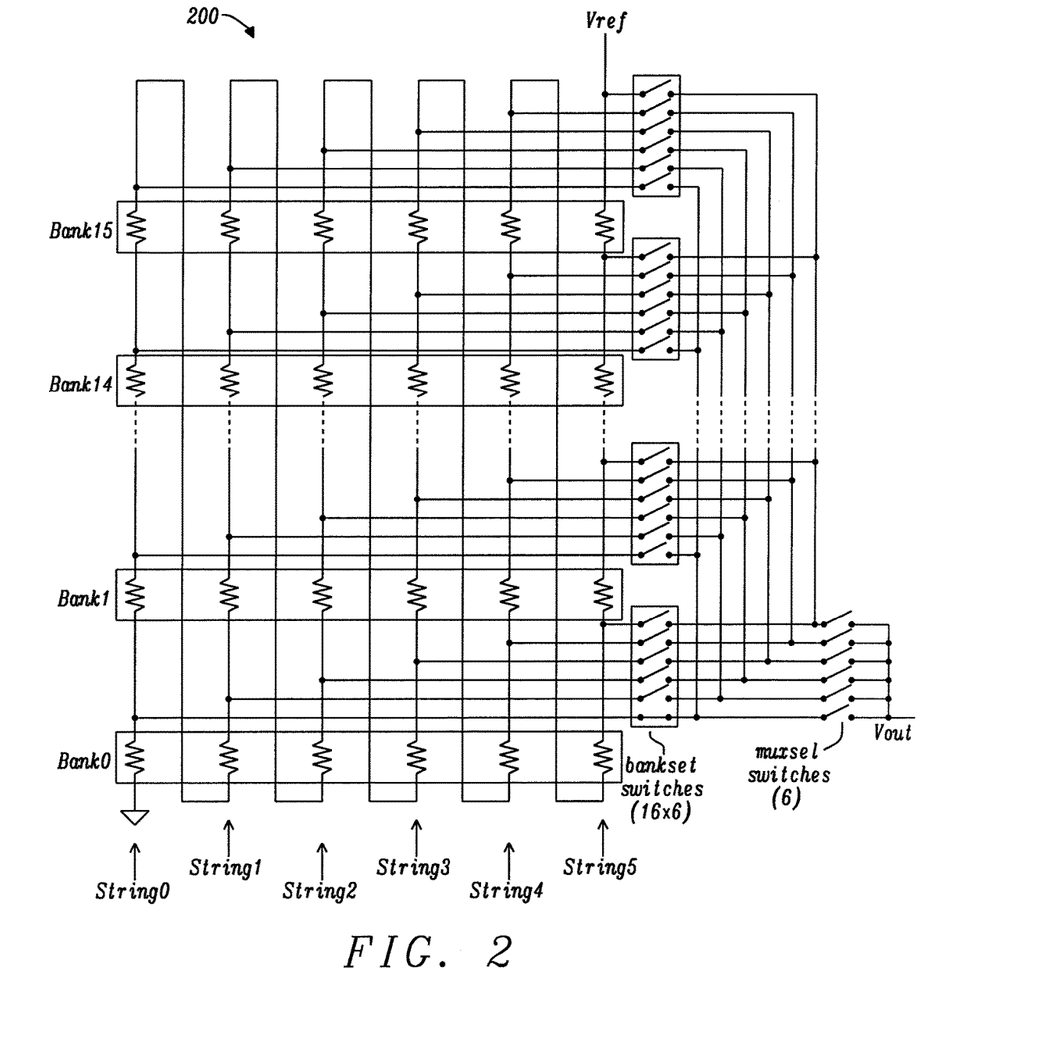
FIG. 2 shows a simplified configuration of a thermometer-coded Digital to Analog Converter (DAC) of the prior art.

In prior art known to the inventor, the amount of control/decoding logic can be improved. In FIG. 2, simplified configuration 200 of the prior art is shown. Here, there are 6 strings of 16 resistor banks (banksels), and 96 switches (16×6). Now each of the 6 strings are connected to a muxsel switch, controlled by a single control signal, and thus only 6+16 control signals are necessary for this implementation. 1 of the 6 muxsel switches is selected using the upper 3 bits of the DAC decoding logic, and 1 of the 16 resistor banks is selected using the lower 4 bits of the DAC decoding logic. When the lower 4 bits of the banksel code is 0, Bank0 of the resistor banks is selected, and when the banksel code is 15, Bank15 of the resistor banks is selected. The resistor banks are supplied with reference voltage Vref, and the control signals are used to determine DAC output voltage Vout.

In the thermometer DAC configuration of FIG. 2, 16+6 control signals are necessary, saving routing area and space for control logic, while the configuration in FIG. 1 needs 96 separate control signals. However, at certain times when the muxsel switches of FIG. 2 are changed, the output spike is very large. This is because the lower 4 bits of the DAC code for the banksel selection increase up to code 15, then go back to code 0. In this case, the next banksel control signal is in the furthest position from the previous timing, for both rising and falling voltages, creating a large charge injection on the DAC output.

Figure 3:
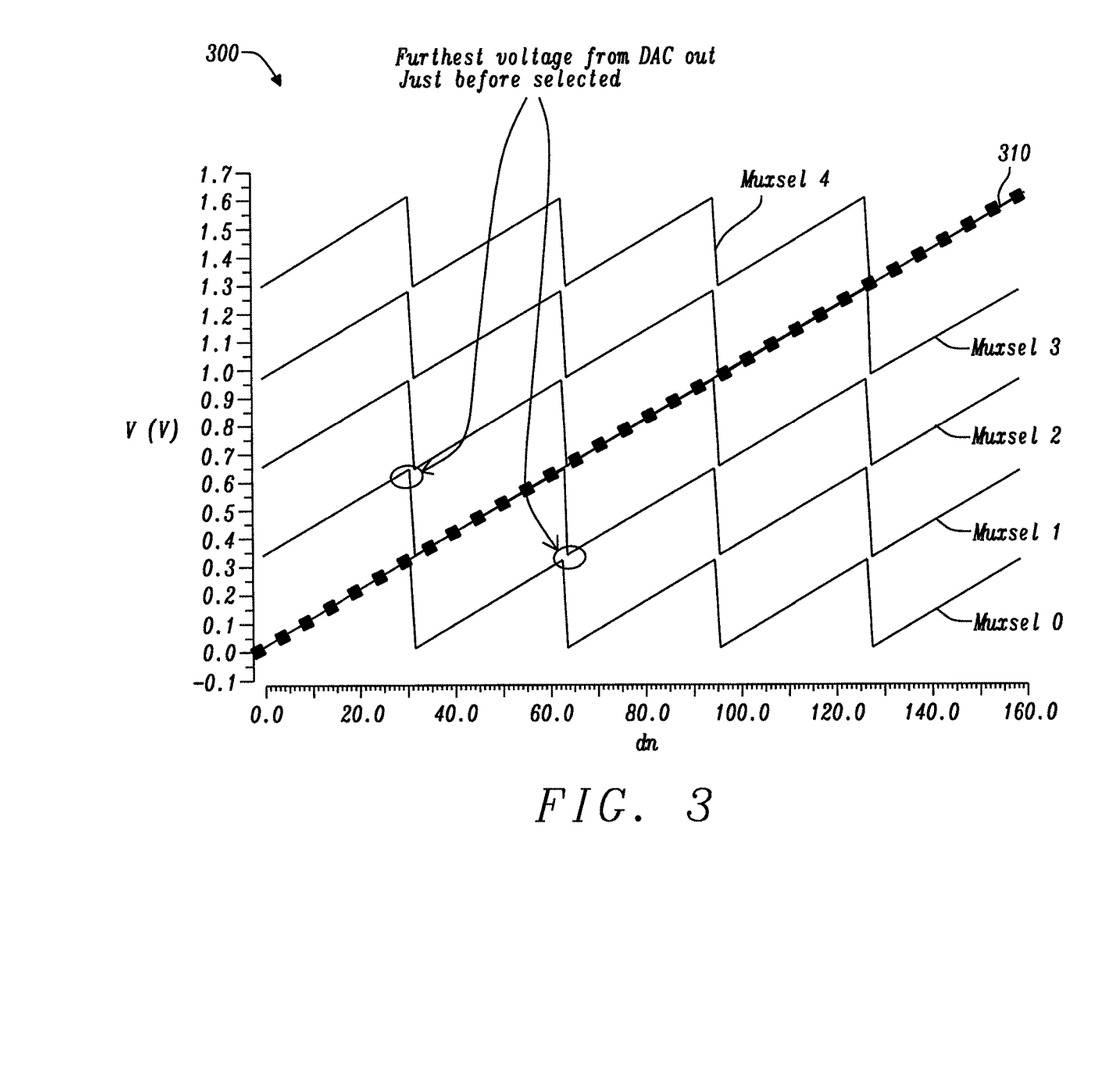
FIG. 3 illustrates banksel selection and DAC output voltage, of a simplified configuration of a thermometer-coded DAC, of the prior art.

In FIG. 3 300, the banksel selection and the DAC output voltage of FIG. 2 are shown. When the upper 3 bits of the code are 0, Muxsel 0 is selected, and when the upper 3 bits of the code are 1, Muxsel 1 is selected. When the original 7-bit DAC code goes from 15 to 16, the banksel code goes from 15 to 0 and the muxsel code goes from 0 to 1, causing the banksel voltage output to be furthest from the target output voltage Vout 310, just before selection, leading to a large output spike (overshoot or undershoot) at Vout.

SUMMARY

An object of the disclosure is to reduce an output spike overshoot or undershoot, during an output transition of a resistor sting based DAC, and more particularly to an n-bit thermometer Digital to Analog Converter (DAC).

A further object of the disclosure is the elimination of a code jump, as the most significant bit of the DAC code changes.

Still further, an object of the disclosure is to reduce the area occupied by a thermometer DAC, by decreasing the number of necessary control signals.

To accomplish the above and other objects, an n-bit thermometer Digital to Analog Converter (DAC) is disclosed, comprising 'm' banks of resistors connected together in 'p' strings, where an mth resistor of a first of the strings is connected to an mth resistor of a second of the strings, where a $1^{st}$ resistor of the second of the strings is connected to a $1^{st}$ resistor of a third of the strings, and with connections between remaining strings continuing in a similar pattern until a pth string. The n-bit thermometer DAC is further comprised of a set of 'p' switches connected to each of the resistors in each of the banks. An up/down counter is configured to control said set of 'p' switches.

The above and other objects are further achieved by a method for a thermometer-coded Digital to Analog Converter (DAC). The steps include providing for 'm' banks of resistors connected together in 'p' strings. The steps also include connecting an mth resistor of a first of the strings to an mth resistor of a second of the strings, connecting a first resistor of the second of the strings to a first resistor of a third of the strings, and connecting remaining strings in a similar pattern until a pth string. The steps also include connecting a set of 'p' switches to each of the resistors in each of the banks. The steps also include controlling the set of 'p' switches with an up/down counter.

In various embodiments the n-bit thermometer-coded DAC may be achieved using any combination of muxsel and banksel switches, up to $2^n$ switches.

DETAILED DESCRIPTION

A thermometer-coded Digital to Analog Converter (DAC) is described, whose output is changed with fast speed, and reduced output spike (overshoot or undershoot). The thermometer-coded DAC has additional selection switches and an up/down counter, in contrast to previously known designs. The DAC code is separated into higher bits (for muxsel, or string, selection) and lower bits (for banksel, or bank, selection). The lower bits increase up to a maximum code, then decrease. This configuration reduces output spike, especially at the DAC code changing point.

There are advantages of reducing overshoot and undershoot output voltage spikes. If the spikes are large enough, a monotonically increasing or decreasing output cannot be maintained. In addition, the DAC output voltage may be used as a reference voltage, and the block using this reference voltage tracks the spike, resulting in additional current consumption. Furthermore, high frequency noise, created by overshoot and undershoot output voltage spikes, may cause the system within which the DAC is located to malfunction.

For example when the DAC code changes from 0111 to 1000, there is the elimination of a code jump, as the most significant bit changes. Just before the muxsel switch changes, controlling the selection of 1 of 6 strings of resistors, the future banksel switch, controlling the selection of 1 of 16 resistors in the string, has already moved to the closest location for the next DAC code.

In the present disclosure, a new resistor arrangement helps to achieve this. When the DAC code changes, some of the resistor banksel outputs change in a way opposite to the others. The next banksel switch output is set to the closest position as the previous timing, for both rising and falling voltages.

Figure 4:
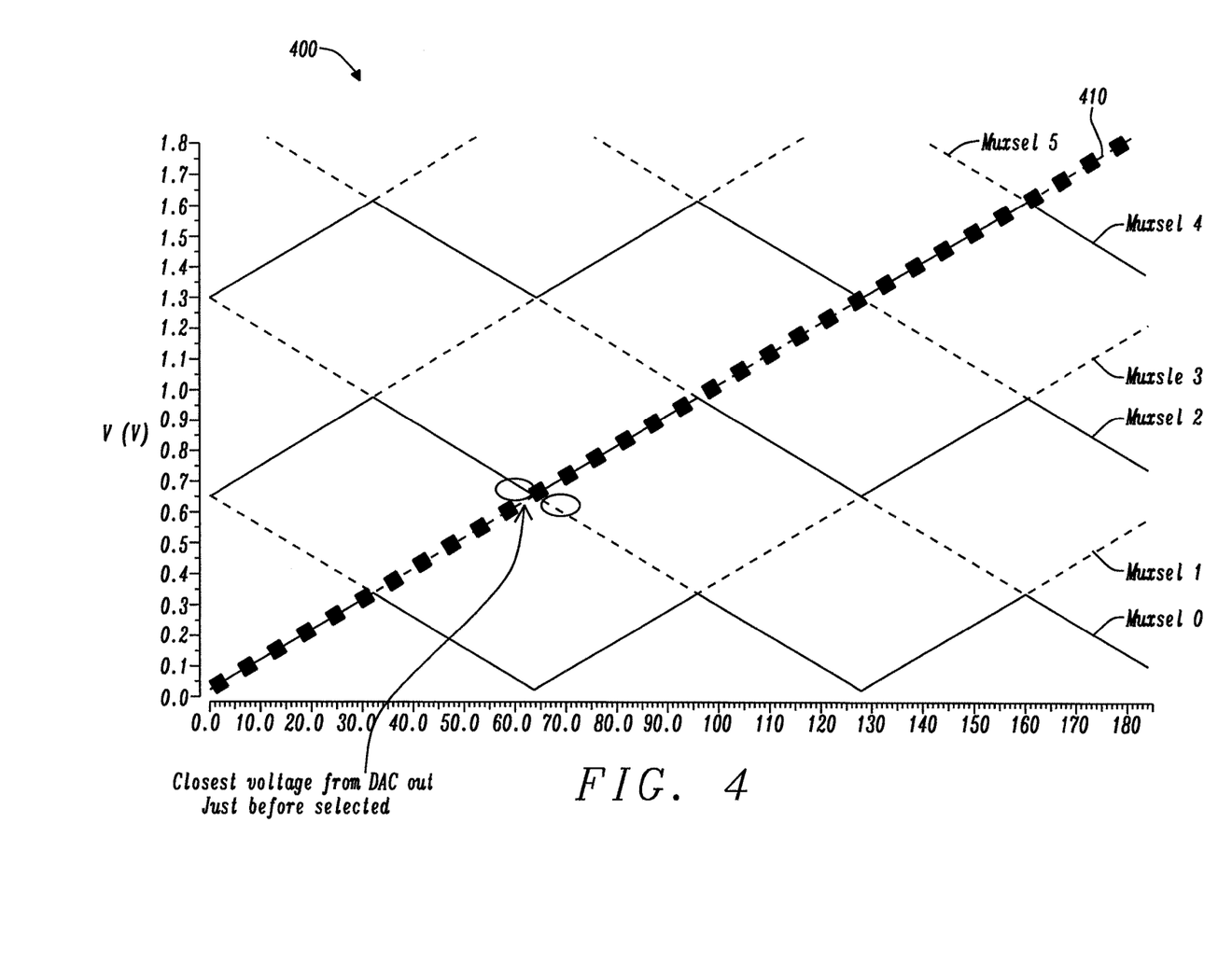
FIG. 4 shows banksel selection and DAC output voltage, embodying the principles of the disclosure.

FIG. 4 400 shows the banksel selection and the DAC output voltage, embodying the principles of the disclosure. Now, some non-selected banksel outputs change such that they cancel the charge injection effect of other banksel outputs. The banksel outputs corresponding to Muxsel switch inputs 1, 3 and 5, change in an opposite direction (decrementing rather than incrementing) to the banksel outputs corresponding to Muxsel switch inputs 0, 2 and 4. This causes the banksel output voltage to be closest to the target output voltage Vout 410, just before selection.

There are two key features of the present disclosure. One feature is the connections between the 6 strings of resistors. Another feature is the behavior of the lower 4 bits of the DAC code, controlling the selection of the 16 resistors in each string.

Figure 5A:
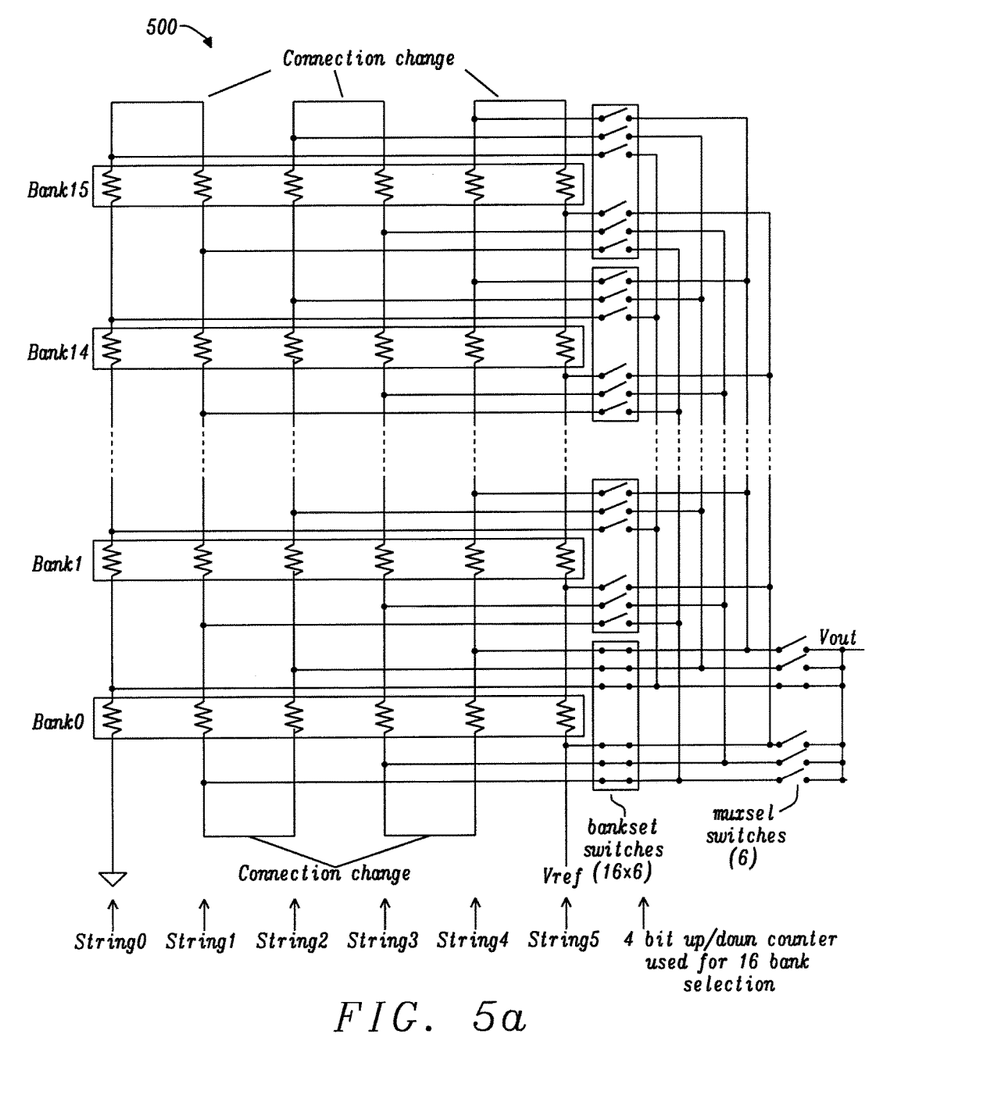
FIG. 5a illustrates the configuration of the connections between 6 strings of resistors, embodying the principles of the disclosure.

FIG. 5a, configuration 500 of the connections between the 6 strings of resistors is shown. Similar to FIG. 2, there are 6 strings of resistors, and 16 switches in each string. Each of the 6 strings of resistors is selected with a muxsel switch, using the upper 3 bits of the DAC decoding logic, and each of the 16 resistors in the string is selected with a banksel switch, using the lower 4 bits of the DAC decoding logic, and an up/down counter.

In FIG. 2 of the prior art, the Bank15 resistor of String0 is connected to the Bank0 resistor of String1, whereas in FIG. 5 of the present disclosure, the Bank 15 resistor of String0 is connected to the Bank15 resistor of String1. In the prior art, the Bank15 resistor of String1 is connected to the Bank0 resistor of String2, and in the present disclosure, the Bank0 resistor of String1 is connected the Bank0 resistor of String2. The configuration of the present disclosure reduces any spike on output voltage Vout, because of the connection of the banksel switch being moved to the switch closest to the location of the next DAC code.

Figure 5B:
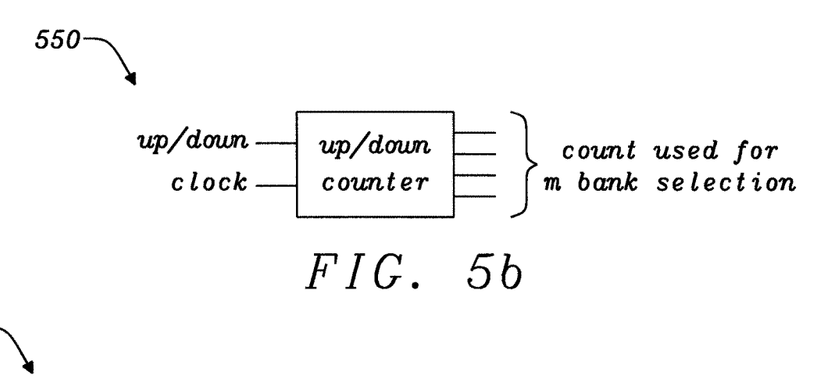
FIG. 5b illustrates the up/down counter used for bank selection, in the disclosure.

FIG. 5b illustrates up/down counter 550 used for bank selection, in the disclosure. The up/down, or bidirectional, counter receives a control signal that determines the direction of the count, as well as a clock signal. The output of the counter is used for the bank of resistors selection in FIG. 5a and FIG. 7b.

Figure 6:
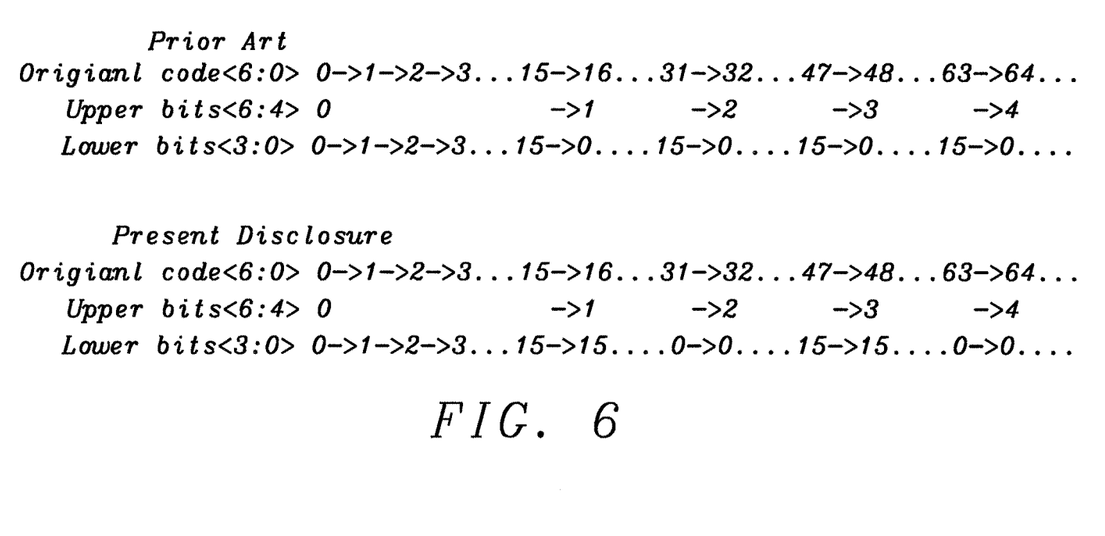
FIG. 6 shows the behavior of the lower 4 bits of a DAC code, embodying the principles of the disclosure.

In FIG. 6, behavior of the lower 4 bits of the DAC code 600 is shown. In the prior art, the DAC code is a 1-step increment code. In the present disclosure, the lower 4 bits of the DAC code increase from 0 to 15, then decrease from 15 to 0, repeating this pattern, controlling the selection of the 16 resistors in each of the 6 strings of resistors. Even though the lower bits of the DAC code are used differently between the prior art and the present disclosure, the DAC output is still increasing with a 7-bit code.

Figure 7A:
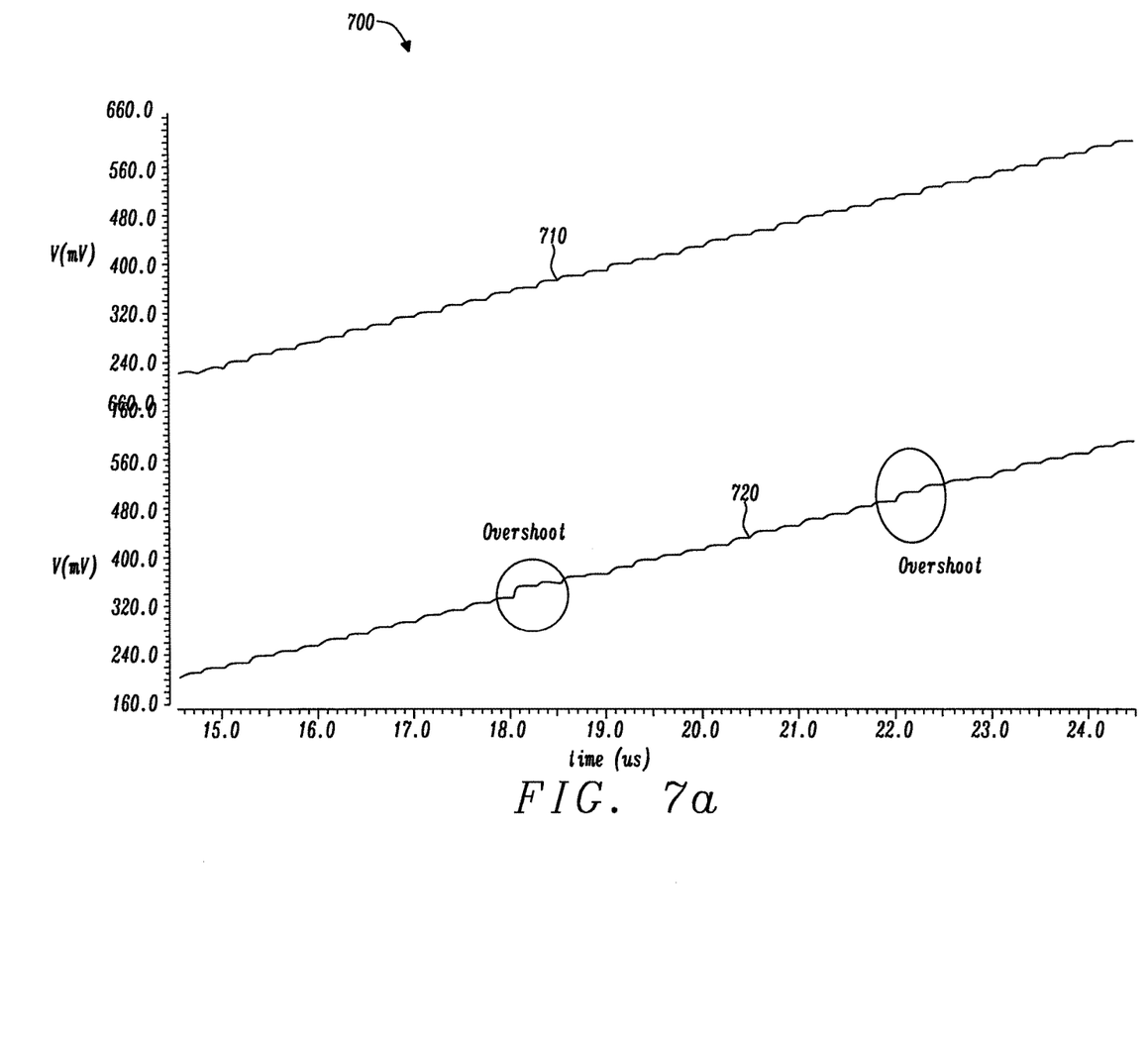
FIG. 7a illustrates a simulation comparison between the prior art and the present disclosure.

In FIG. 7a, simulation comparison 700 is shown between the prior art and the present disclosure. In prior art 720, overshoot is due to the lower 4 bits of the DAC code increasing up to code 15, then going back to code 0 again and creating a large charge injection on the DAC output voltage. In present disclosure 710, the connection of the banksel switches are moved to the closest location of the next DAC code. The increasing of the lower 4 bits of the DAC code from 0 to 15, and then the decreasing of the lower 4 bits of the DAC code from 15 to 0, reduces any spike on the output voltage.

The above description shows, for example only, the use of 6 strings of resistors, each controlled by a muxsel switch, and 16 resistors in each string, each controlled by a banksel switch. The number of resistor strings and banks may of course vary. The present disclosure further comprises a DAC code of 3 higher bits for muxsel control, and 4 lower bits for banksel control. Note that any combination of muxsel and banksel switches can be similarly configured for a n-bit DAC code, for up to $2^n$ switches.

Figure 7B:
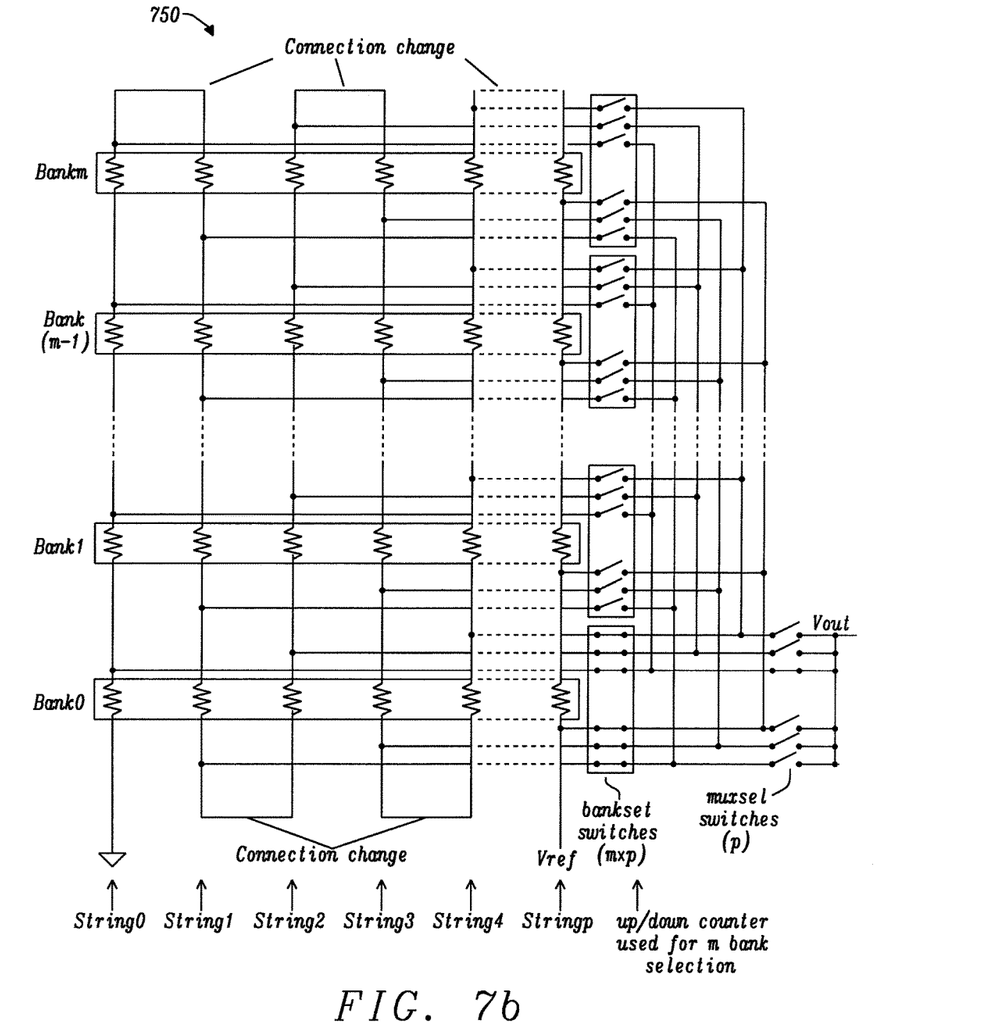
FIG. 7b illustrates the configuration of the connections between p strings of resistors, in the disclosure.

FIG. 7b illustrates configuration 750 of the connections between p strings of resistors, in the disclosure. Here there are m banks, labeled Bank0, Bank1, up to Bank m. Generally, the number of muxsel switches will equal the number of strings. Similarly, the number of banksel switches will equal the number of banks of resistors. Each of the p strings of resistors is selected using the upper bits of the DAC decoding logic, and each of the m resistors in the string is selected using the lower bits of the DAC decoding logic, and an up/down counter.

Figure 8:
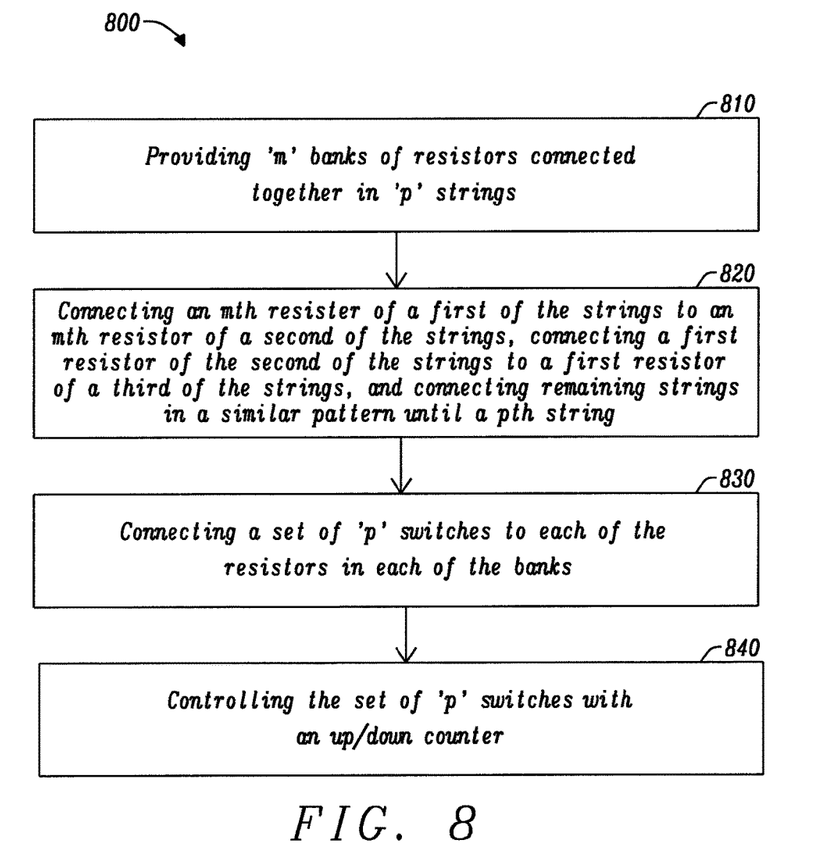
FIG. 8 shows a method for a thermometer-coded Digital to Analog Converter, embodying the principles of the disclosure.

FIG. 8 is flow chart 800, of a method for a thermometer-coded Digital to Analog Converter (DAC). Step 810 provides for 'm' banks of resistors connected together in 'p' strings. Step 820 connects an mth resistor of a first of the strings to an mth resistor of a second of the strings, connecting a first resistor of the second of the strings to a first resistor of a third of the strings, and connecting remaining strings in a similar pattern until a pth string. Step 830 connects a set of 'p' switches to each of the resistors in each of the banks. Step 840 controls the set of 'p' switches with an up/down counter.

The advantages of one or more embodiments of the present disclosure include providing a thermometer-coded Digital to Analog Converter (DAC), with a smaller sized area and reduced control signals. The configuration improves resistor string based DAC performance, by minimizing the output overshoot/undershoot, when most significant bits change, in the situation where the DAC input code is continuously ramping up or down.

While this invention has been particularly shown and described with reference to the preferred embodiments thereof, it will be understood by those skilled in the art that various changes in form and details may be made without departing from the spirit and scope of the invention.

The invention claimed is:

1. An n-bit thermometer-coded Digital to Analog Converter (DAC), comprising:
'm' banks of resistors connected together in 'p' strings, wherein an mth resistor of a first of said strings is connected to an mth resistor of a second of said strings, wherein a $1^{st}$ resistor of said second of said strings is connected to a $1^{st}$ resistor of a third of said strings, and with connections between remaining strings continuing in a similar pattern until a pth string;
a set of 'p' switches connected to each of said resistors in each of said banks; and
an up/down counter configured to control said set of 'p' switches, with a DAC code separated into lower bits and higher bits.

2. The thermometer-coded DAC of claim 1, configured such that when a voltage from said DAC is to be connected to an output voltage terminal, all banksel switches for a selected bank are switched together.

3. The thermometer-coded DAC of claim 2, configured such that a string from which said voltage is to be read is selected by closing one switch in a muxsel set of switches.

4. The thermometer-coded DAC of claim 3, wherein said DAC code is separated into said lower bits for said banksel switch selection, and into said higher bits for said muxsel switch selection.

5. The thermometer-coded DAC of claim 4, wherein said up/down counter is configured to increase said lower bits of said DAC code up to a maximum code, then decrease.

6. The thermometer-coded DAC of claim 4, configured for a total of $2^n$ of said banksel switches and said muxsel switches.

7. The thermometer-coded DAC of claim 4, wherein said DAC code is configured to change such that there is elimination of a code jump.

8. The thermometer-coded DAC of claim 2, wherein said banksel switches are connected at a location for a next DAC code, from a previous timing, for both rising and falling voltages.

9. The thermometer-coded DAC of claim 2, wherein said banksel switches are configured to change such that they cancel a charge injection effect of other banksel switches.

10. The thermometer-coded DAC of claim 2, wherein said voltage from said DAC is configured to be close to a target output voltage.

11. The thermometer-coded DAC of claim 2, wherein said n-bits comprise a 7-bit code.

12. A method for a thermometer-coded Digital to Analog Converter (DAC) comprising:
providing 'm' banks of resistors connected together in 'p' strings;
connecting an mth resistor of a first of said strings to an mth resistor of a second of said strings, connecting a first resistor of said second of said strings to a first resistor of a third of said strings, and connecting remaining strings in a similar pattern until a pth string;
connecting a set of 'p' switches to each of said resistors in each of said banks; and
controlling said set of 'p' switches with an up/down counter, and a DAC code separated into lower bits and higher bits.

13. The method of claim 12, further comprising switching together all switches in said set of 'p' switches or banksel switches, for a selected bank, when a voltage from said DAC is to be connected to an output voltage terminal.

14. The method of claim 13, further comprising selecting a string for said voltage by closing one switch in a muxsel set of switches.

15. The method of claim 14, further comprising separating said DAC code into said lower bits for said banksel switch selection, and into said higher bits for said muxsel switch selection.

16. The method of claim 12, further comprising increasing said up/down counter to a maximum code, then decreasing said up/down counter.

17. The method of claim 15, wherein changing said DAC code such that there is elimination of a code jump.

18. The method of claim 13, further comprising connecting said banksel switches at a location for a next DAC code, from a previous timing, for both rising and falling voltages.

19. The method of claim 13, wherein changing of said banksel switches cancels a charge injection effect of other banksel switches.

20. The method of claim 13, further comprising configuring said voltage from said DAC close to a target output voltage.

21. The method of claim 13, wherein said n-bits comprise a 7-bit code.

* * * * *